(12) United States Patent
Park et al.

(10) Patent No.: US 7,205,215 B2
(45) Date of Patent: Apr. 17, 2007

(54) FABRICATION METHOD OF THIN FILM TRANSISTOR

(75) Inventors: Byoung-Keon Park, Incheon-si (KR); Jin-Wook Seo, Suwon-si (KR); Tae-Hoon Yang, Seongnam-si (KR); Ki-Yong Lee, Yongin-si (KR)

(73) Assignee: Samsung SDI Co., Ltd., Suwon (KR)

( * ) Notice: Subject to any disclaimer, the term of this patent is extended or adjusted under 35 U.S.C. 154(b) by 28 days.

(21) Appl. No.: 11/011,580

(22) Filed: Dec. 15, 2004

(65) Prior Publication Data

US 2006/0040429 A1 Feb. 23, 2006

(30) Foreign Application Priority Data

Aug. 20, 2004 (KR) .................. 10-2004-0066090

(51) Int. Cl.
*H01L 21/20* (2006.01)
*H01L 21/36* (2006.01)

(52) U.S. Cl. .............. 438/487; 438/535; 438/680; 438/308; 257/E21; 257/17; 257/134

(58) Field of Classification Search ........... 438/149, 438/197, 199, 308, 166, 463, 488, 535, 515, 438/657, 756, 757, 680
See application file for complete search history.

(56) References Cited

U.S. PATENT DOCUMENTS 5,529,937 A * 6/1996 Zhang et al. .......... 438/471
5,705,829 A * 1/1998 Miyanaga et al. ......... 257/66
5,932,893 A * 8/1999 Miyanaga et al. ......... 257/66
6,071,766 A * 6/2000 Yamazaki et al. ........ 438/166
6,475,840 B1 * 11/2002 Miyanaga et al. ........ 438/166

FOREIGN PATENT DOCUMENTS

| JP | 08-097137 | 4/1996 |
| JP | 11-168215 | 6/1999 |
| JP | 11-251241 | 9/1999 |
| JP | 2000-228360 | 8/2000 |
| JP | 2001-135574 | 5/2001 |
| JP | 2001-267240 | 9/2001 |
| JP | 2003-163165 | 6/2003 |
| KR | 1994-0022675 | 10/1994 |
| KR | 1020030060403 | 7/2003 |

* cited by examiner

*Primary Examiner*—David Nhu
(74) *Attorney, Agent, or Firm*—H.C. Park & Associates, PLC (57) ABSTRACT

The present invention provides a fabrication method of thin film transistor including a step of forming an amorphous silicon layer on a substrate, a step of forming a capping layer on the amorphous silicon layer, a step of forming a metal catalyst layer on the capping layer, a step of diffusing metal catalyst by selectively irradiating a laser beam onto the metal catalyst layer, and a step of crystallizing the amorphous silicon layer. The present invention has an advantage that a fabrication method of thin film transistor is provided, wherein the fabrication method of thin film transistor improves characteristics of device and obtains uniformity of the device by uniformly controlling diffusion of low concentration of metal catalyst through selective irradiation of laser beam and controlling size of grains and crystal growing position and direction in crystallization of amorphous silicon layer using super grain silicon method.

20 Claims, 6 Drawing Sheets

FABRICATION METHOD OF THIN FILM TRANSISTOR

CROSS REFERENCE

This application claims the benefit of Korean Patent Application No. 2004-66090, filed on Aug. 20, 2004, the disclosure of which is hereby incorporated herein by reference in its entirety.

BACKGROUND OF THE INVENTION

1. Field of the Invention

The present invention relates to a fabrication method of thin film transistor, more particularly, to a fabrication method of thin film transistor comprising the step of crystallizing the metal catalyst by selectively irradiating laser beam onto metal catalyst, thereby diffusing the metal catalyst in crystallization using super grain silicon method.

2. Description of Related Art

Generally, a polycrystalline silicon layer is used for various purposes of semiconductor layer for thin film transistor since the polycrystalline silicon layer has merits that it has high electric field effect mobility, it is applied to circuits operated at high speed, and it enables CMOS circuit to be constructed. A thin film transistor using the polycrystalline silicon layer is mostly used in active elements of active matrix liquid crystal display (AMLCD) and switching elements and driving elements of organic light emitting diode (OLED).

The polycrystalline silicon layer used in the thin film transistor is fabricated by direct deposition, high temperature thermal annealing or laser annealing. In case of the laser annealing, many alternative technologies are being studied since expensive laser equipment is required although the laser annealing is performed at low temperature, and high electric field effect mobility is obtained by the laser annealing.

At present, a method for crystallizing amorphous silicon using metal is mostly being studied since the method has merits that the amorphous silicon is promptly crystallized at a lower temperature compared with solid phase crystallization. A crystallization method using metal is divided into metal induced crystallization method and metal induced lateral crystallization method. However, the crystallization method using metal also has problems that characteristics of elements for thin film transistor are deteriorated due to metal contamination.

On the other hand, a technology of forming a polycrystalline silicon layer of good quality by controlling concentration of ions of metal through ion injector, thereby performing high temperature annealing, rapid thermal annealing or laser irradiation and a method for crystallizing the thin film by thermal annealing process after depositing a thin film by spin coating a mixture of organic film having viscous property and liquid phase metal on the polycrystalline silicon layer to flatten the surface of polycrystalline silicon layer as metal induced crystallization method are developed to reduce quantity of metal and form a polycrystalline silicon layer of good quality. However, even in case of the crystallization method, there are problems in aspects of scale-up of grain size and uniformity of grains that are the most important in polycrystalline silicon layer.

In order to solve the foregoing problems, a method for manufacturing polycrystalline silicon layer as a crystallization method using cover layer has been developed as disclosed in Korean Patent Laid-open Publication No. 2003-0060403. The method is a method for obtaining a polycrystalline silicon layer using the seed after forming a seed by depositing a metal catalyst layer on the capping layer and diffusing metal catalyst into the amorphous silicon layer through the capping layer using thermal annealing or laser annealing after forming an amorphous silicon layer on a substrate and forming a capping layer on the amorphous silicon layer. The foregoing method has merits that required level or more of metal contamination is prevented since the metal catalyst is diffused through a cover layer. However, the foregoing method also has problems that it is difficult to uniformly control low concentration of metal catalyst and control crystallization starting position, growing direction and grain size.

SUMMARY OF THE INVENTION

Therefore, in order to solve the foregoing problems of the prior art, it is an object of the present invention to provide a fabrication method of thin film transistor which improves characteristics of device and obtains uniformity of the device by forming a seed through selective irradiation of laser beam and crystallizing the seed in crystallization using super grain silicon method, thereby controlling size of grains and position and direction of crystal growth.

In order to achieve the foregoing object, the present invention provides a fabrication method of thin film transistor comprising a step of forming an amorphous silicon layer on a substrate; a step of forming a capping layer on the amorphous silicon layer; a step of forming a metal catalyst layer on the capping layer; a step of diffusing metal catalyst by selectively irradiating a laser beam onto the metal catalyst layer; and a step of crystallizing the amorphous silicon layer.

Furthermore, the present invention provides a fabrication method of thin film transistor comprising a step of forming an amorphous silicon layer on a substrate; a step of forming a capping layer on the amorphous silicon layer; a step of forming a metal catalyst layer on the capping layer; a step of forming a metal catalyst protection layer on the metal catalyst layer; a step of diffusing metal catalyst by selectively irradiating a laser beam onto the metal catalyst protection layer; and a step of crystallizing the amorphous silicon layer.

The laser beam is a dot type laser beam or a line type laser beam, and the dot type laser beam is formed in a circular, triangular, rectangular, trapezoidal or rhombic sectional shape if the laser beam is a dot type laser beam. Furthermore, the laser beam is irradiated through a patterned mask.

The crystallization of the amorphous silicon layer is performed by thermal annealing.

The metal catalyst protection layer is formed of a silicon nitride film or silicon oxide film and formed of a film that can be etched together with the capping layer at the same time.

BRIEF DESCRIPTION OF THE DRAWINGS

The above and other features and advantages of the present invention will become more apparent to those of ordinary skill in the art by describing in detail preferred embodiments thereof with reference to the attached drawings in which.

EXPLANATION OF MARKS FOR PRINCIPAL PARTS OF DRAWINGS

100: substrate
110: buffer layer
120: amorphous silicon layer
130: capping layer
140: metal catalyst
150: seed
160, 170, 180, 260, 360, 460: laser beam
125: polycrystalline silicon layer
190: semiconductor layer pattern
195: gate insulating film
196: gate electrode
265, 465: patterned mask
345: metal catalyst protection layer

DETAILED DESCRIPTION OF THE INVENTION

The present invention will now be described in detail in connection with preferred embodiments with reference to the accompanying drawings. For reference, like reference characters designate corresponding parts throughout several views.

An amorphous silicon layer is crystallized using a super grain silicon method in the present invention, wherein the super grain silicon method is a crystallization method capable of controlling size of grains and crystal growing position and direction by forming a seed through selective diffusion of metal catalyst and crystallizing the amorphous silicon layer.

Figure 1A:
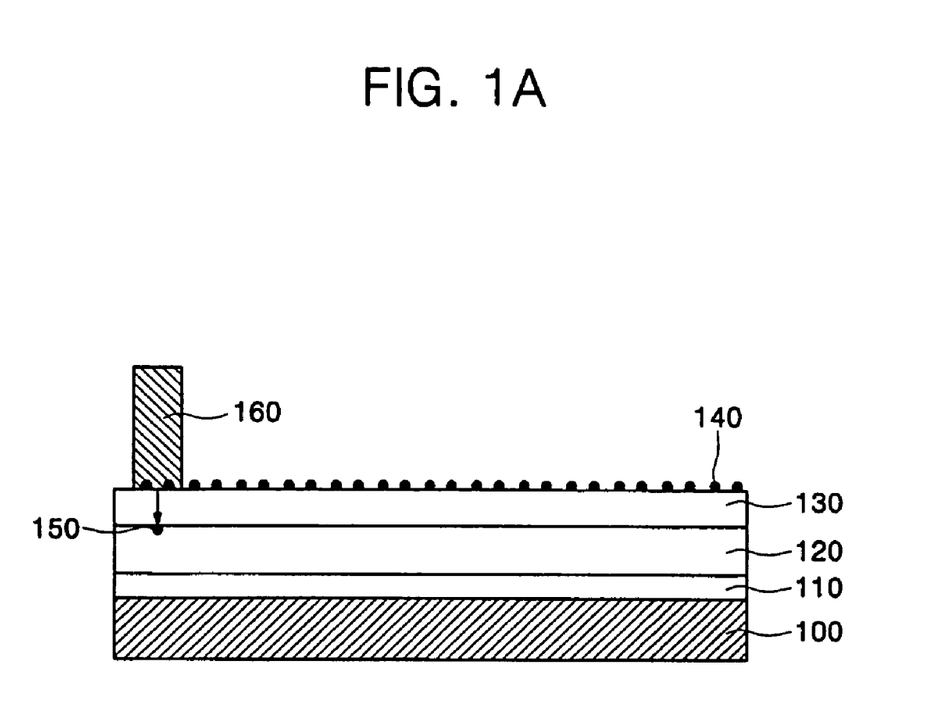
FIG. 1a to FIG. 1e are process flow charts for explaining fabrication methods of thin film transistor according to first and second preferred embodiments of the present invention.

FIG. 1a to FIG. 1e are process flow charts for explaining fabrication methods of thin film transistor according to first and second preferred embodiments of the present invention, wherein the FIG. 1a is a cross-sectional structure chart for explaining fabrication methods of thin film transistor according to first and second preferred embodiments of the present invention.

Referring to FIG. 1a, a buffer layer 110 is formed on a substrate 100. An insulating substrate such as glass is used as the substrate 100, and the buffer layer 110 plays a role of protecting a semiconductor layer formed in the succeeding process from impurities discharged from the substrate 100. The buffer layer 110 is preferably formed of a silicon oxide film.

An amorphous silicon layer 120 is formed all over the buffer layer 110 formed substrate, wherein the amorphous silicon layer 120 can be formed by chemical vapor deposition.

A capping layer 130 is formed on the amorphous silicon layer 120. The capping layer 130 can be formed of a silicon nitride film or silicon oxide film and formed by plasma enhanced chemical vapor deposition.

The capping layer 130 is formed in such a manner that a metal catalyst to be mentioned later is diffused into the capping layer, wherein it is preferable that the capping layer has thickness of 5 to 2000 Å. It is preferable that the capping layer is formed to the thickness of 5 to 2000 Å since it is difficult to control low concentration of the metal catalyst if thickness of the capping layer is 5 Å or less while it is difficult to diffuse the metal catalyst if thickness of the capping layer is 2000 Å or more. Furthermore, since an oxide film or nitride film generally functions as a barrier in diffusion of impurities, the metal catalyst can be easily diffused by lowering density of silicon oxide film or silicon nitride film.

Subsequently, a layer of metal catalyst 140 is formed on the capping layer 130, wherein nickel is used as the metal catalyst 140, and the metal catalyst layer can be deposited on the capping layer using a sputter. Additionally, the metal catalyst layer can be deposited on the capping layer using ion implantation method and plasma method, wherein the metal catalyst layer can be deposited on the capping layer using the plasma method by arranging a metal material on the capping layer 130 and exposing the metal material arranged on the capping layer to plasma.

It is preferable that thickness of the layer of the metal catalyst 140 formed by the methods is 2 Å or less. The metal catalyst is not deposited sparsely on the capping layer, but deposited densely on the capping layer to control low concentration of the metal catalyst, wherein if thickness of the metal catalyst layer to be formed is 2 Å or more, it is difficult to control low concentration of the metal catalyst due to concentration increase of the metal catalyst, leakage current of transistor is increased due to concentration increase of the metal catalyst in silicon, and size of grains of polycrystalline silicon layer to be mentioned later is decreased.

The metal catalyst 140 is diffused into the amorphous silicon layer 120 by irradiating a laser beam 160 onto the layer of the metal catalyst 140, wherein a laser beam is irradiated onto the selected diffusion range of the metal catalyst by selecting a diffusion range of the metal catalyst 140 so that a seed 150 to be mentioned later is formed on a desired part.

The metal catalyst 140 is diffused into the amorphous silicon layer 120 through the capping layer 130 by selectively irradiating the laser beam onto the metal catalyst layer. The diffused metal catalyst 140 forms the seed 150 in the amorphous silicon layer 120. The seed 150 means metal silicide formed when the metal catalyst is contacted with silicon. Crystallization to be described later is performed from the seed 150, wherein generally about 1/100 of the metal catalyst is diffused to form the seed.

As described in the above, the metal catalyst is diffused in the present invention by selectively irradiating a laser beam onto the metal catalyst with the laser beam to be irradiated being formed in various shapes.

Figure 1B:
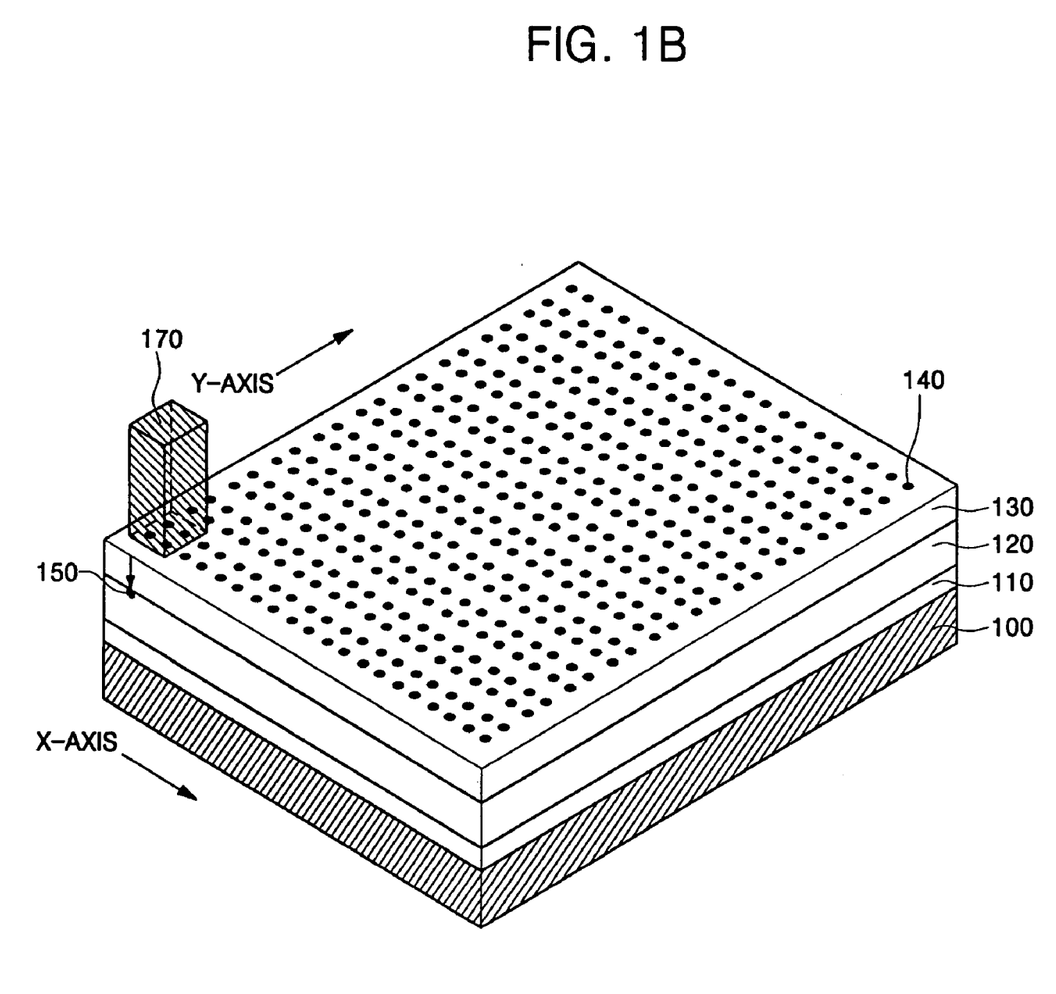

FIG. 1b is a perspective view at cross section illustrated in FIG. 1a to explain a fabrication method of thin film transistor according to first preferred embodiment of the present invention.

Referring to FIG. 1b, the metal catalyst 140 is diffused into the amorphous silicon layer 120 through the capping layer 130 by selectively irradiating laser beam 170 onto the layer of the metal catalyst 140.

It can be seen that the laser beam 170 is a dot type laser beam, and an irradiation region is limited to a partially selected region.

A region onto which the laser beam is to be irradiated is selected by moving the laser unit in an X-axis direction of the substrate 100 after selectively irradiating a laser beam 170 onto the metal catalyst layer as a certain laser unit is being moved in a Y-axis direction of substrate 100. A region onto which the laser beam is to be irradiated is selected again by moving the laser unit in an X-axis direction of the substrate 100 after selectively irradiating a laser beam 170 onto the metal catalyst layer as moving the laser unit in a Y-axis direction of substrate 100. By repeating the foregoing processes, the laser beam 170 is irradiated onto the metal catalyst layer so that the metal catalyst 140 is diffused into a desired part of the amorphous silicon layer to form a seed 150.

Although a dot type laser beam having a rectangular cross sectional shape is illustrated in FIG. 1b, a dot type laser beam having a circular, triangular, trapezoidal or rhombic cross sectional shape can also be used. Additionally, a dot type laser beam having other cross sectional shapes can be used.

Figure 1C:
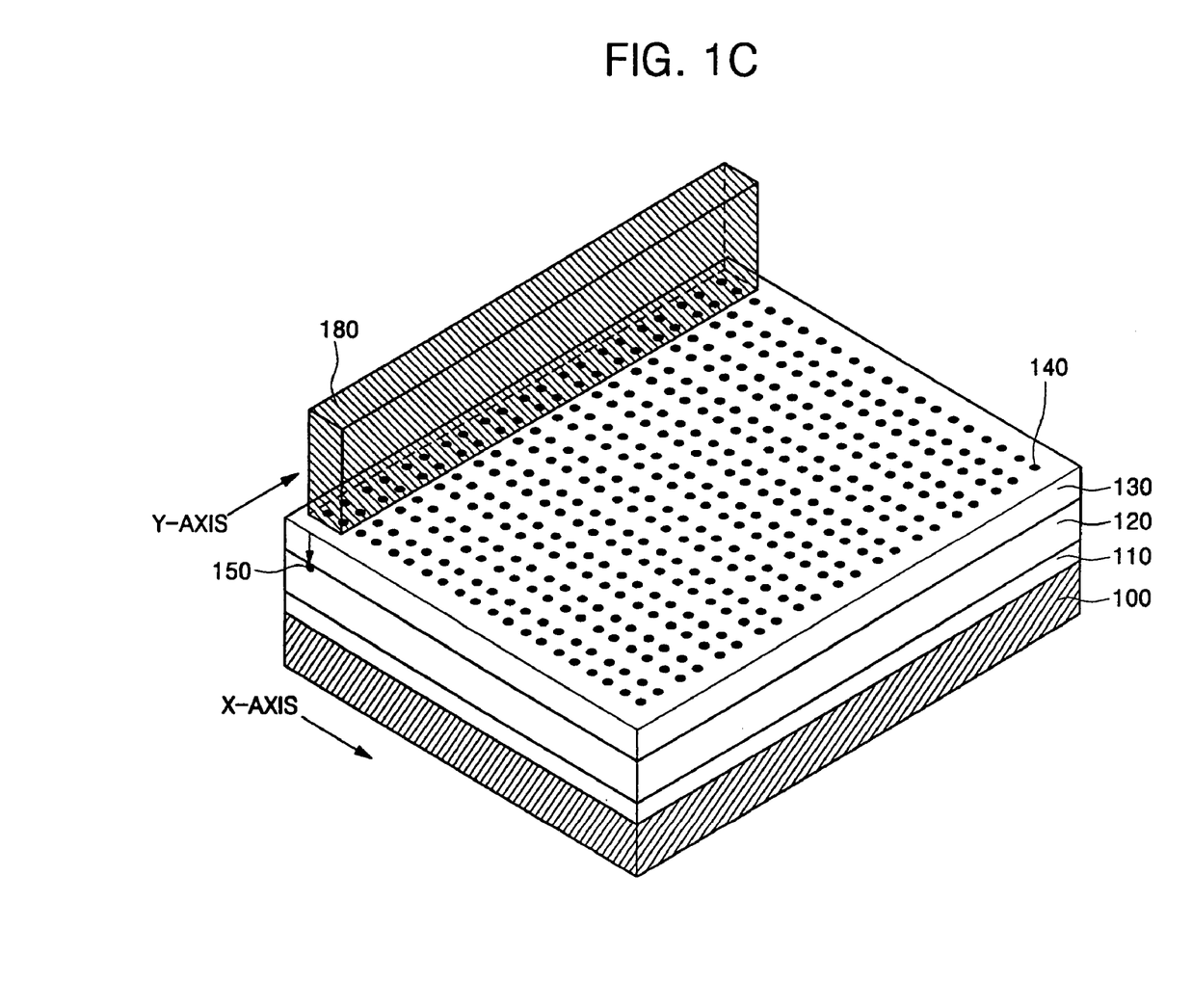

FIG. 1c is a perspective view at cross section illustrated in FIG. 1a to explain a fabrication method of thin film transistor according to second preferred embodiment of the present invention.

Referring to FIG. 1c, the metal catalyst 140 is diffused into the amorphous silicon layer 120 through the capping layer 130 by selectively irradiating laser beam 180 onto the layer of the metal catalyst 140.

It can be seen that the laser beam 180 is a line type laser beam, and an irradiation region is limited to a selected line shaped region.

A region onto which the laser beam is to be irradiated is selected by moving a certain laser unit in an X-axis direction of a substrate 100 after selectively irradiating a line type laser beam 180 onto a layer of metal catalyst 140. A region onto which the laser beam is to be irradiated is selected again by moving the laser unit in an X-axis direction of the substrate 100 after irradiating the line type laser beam 180 onto the metal catalyst layer. By repeating the foregoing processes, the laser beam is irradiated onto the metal catalyst layer so that the metal catalyst 140 is diffused into a desired part of the amorphous silicon layer to form a seed 150.

Although a line type laser beam 180 capable of being irradiated on a Y-axis region of the substrate at one time is exemplified in FIG. 1c, a method for selecting a region onto which the laser beam is to be irradiated by moving the laser unit in an X-axis direction of the substrate 100 after selectively irradiating the line type laser beam 180 onto the layer of the metal catalyst 180 as moving the certain laser unit in a Y-axis direction of the substrate 100 as illustrated in FIG. 1b can be used in case that the Y-axis region of the substrate can not be irradiated at one time.

Figure 1D:
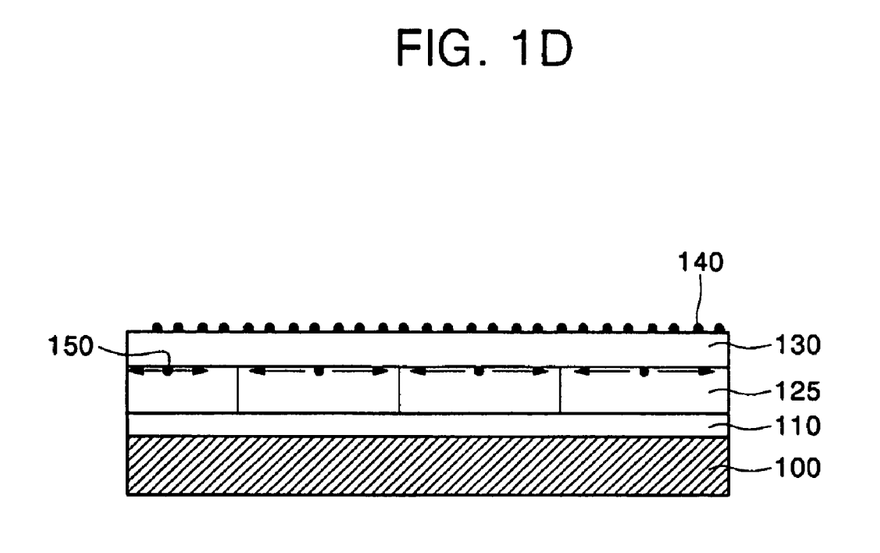

Referring to FIG. 1d, a polycrystalline silicon layer 125 is formed by crystallizing the amorphous silicon layer 120 including the seed 150 formed by diffusion. The crystallization is performed through thermal annealing, and the thermal annealing can be performed by heating the amorphous silicon layer in a furnace for a long time, wherein the thermal annealing can be carried out in the temperature range of 400 to 1000° C., preferably in the temperature range of 550 to 600° C. If the thermal annealing is performed in the foregoing temperature range, the polycrystalline silicon layer is grown to the side from the seed 150 and contacted with neighboring grains so that the polycrystalline silicon layer is completely crystallized as forming a grain boundary. The polycrystalline silicon layer 125 crystallized by the super grain silicon method can be grown to a grain size of 3 to 400 μm. Therefore, a part having good crystallinity is formed even inside grains as a channel forming part for forming a channel layer to be mentioned later.

As described in the above, grain size and crystal growing position and direction of the polycrystalline silicon layer can be controlled in the present invention by selecting a diffusion region of metal catalyst and irradiating a laser beam onto the selected diffusion region of the metal catalyst. Furthermore, characteristics of device for thin film transistor are improved and uniformity of the device is obtained accordingly if the channel layer is formed at a part having good crystallinity as described in the above.

Figure 1E:
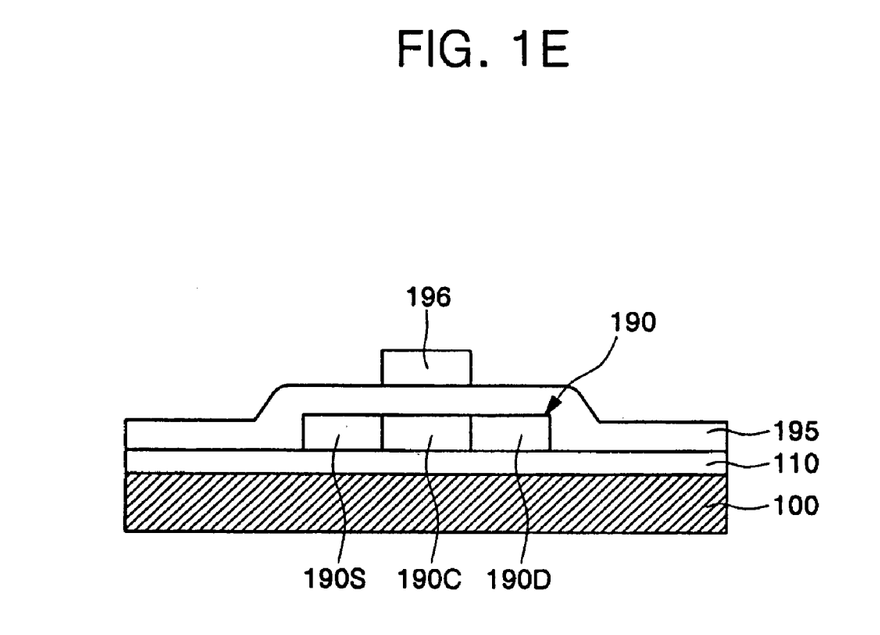

Referring to FIG. 1e, the capping layer 130 and metal catalyst layer 140 are removed through etching after crystallizing the amorphous silicon layer 120 using super grain silicon method. A required level or more of metal contamination is prevented from generating on the crystallized polycrystalline silicon layer 125 by removing the foregoing structures.

Next, source/drain regions 190S, 190D and channel layer 190C are formed by patterning the polycrystalline silicon layer 125 and performing ion implantation process. That is, a semiconductor layer pattern 190 is formed.

A metal layer and a photoresist layer are sequentially laid up on the gate insulating film 195 after forming a gate insulating film 195 on the semiconductor layer pattern 190. A gate electrode 196 is formed by patterning the photoresist layer and etching the metal layer using the patterned photoresist layer as a mask. A thin film transistor is completed by using the resulting material.

Figure 2:
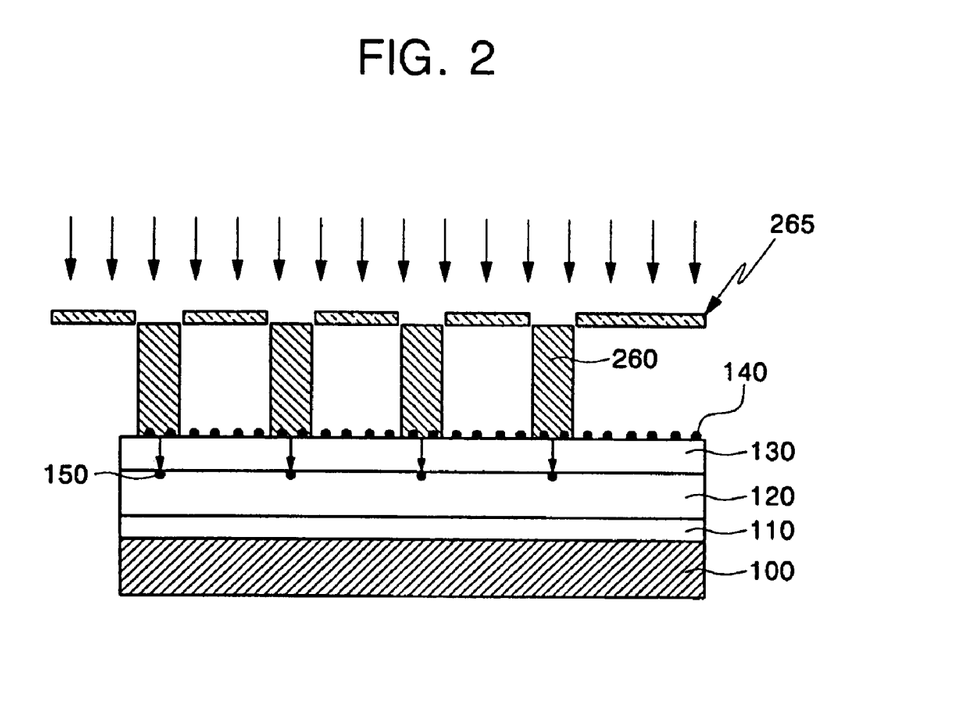
FIG. 2 is a cross-sectional structure chart for explaining a fabrication method of thin film transistor according to third preferred embodiment of the present invention.

FIG. 2 is a cross-sectional structure chart for explaining a fabrication method of thin film transistor according to third preferred embodiment of the present invention.

Referring to FIG. 2, a buffer layer 110, amorphous silicon layer 120, capping layer 130 and layer of metal catalyst 140 are sequentially laid up on a substrate 100.

A laser beam 260 is irradiated onto the layer of metal catalyst 140 so that the metal catalyst 140 is diffused into the amorphous silicon layer 120, wherein the laser beam 260 is irradiated onto the layer of metal catalyst 140 through a patterned mask 265 so that a seed 150 is formed on a desired part.

The third preferred embodiment of the present invention has a merit that process time is reduced by using the patterned mask 265, thereby selecting a larger region so that the laser beam is irradiated onto the selected region differently from the first and second preferred embodiments.

A fabrication method of thin film transistor according to the third preferred embodiment of the present invention is the same as the fabrication method of thin film transistor according to the first preferred embodiment of the present invention except the above mentioned description.

Figure 3:
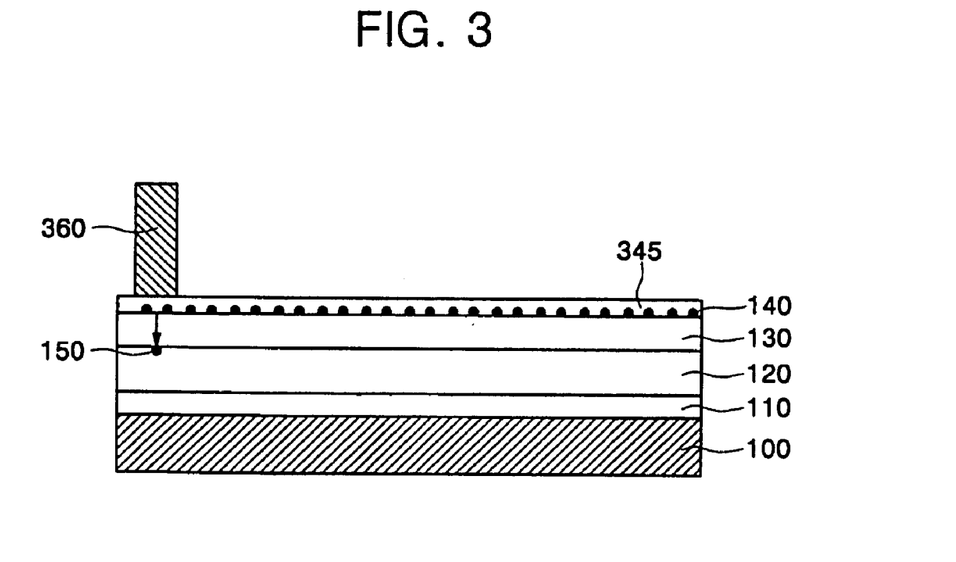
FIG. 3 is a cross-sectional structure chart for explaining a fabrication method of thin film transistor according to fourth preferred embodiment of the present invention.

FIG. 3 is a cross-sectional structure chart for explaining a fabrication method of thin film transistor according to fourth preferred embodiment of the present invention.

Referring to FIG. 3, a buffer layer 110, amorphous silicon layer 120, capping layer 130 and layer of metal catalyst 140 are sequentially laid up on a substrate 100.

In the fourth preferred embodiment of the present invention, a metal catalyst protection layer 345 is formed on the layer of metal catalyst 140.

A laser beam 360 is irradiated onto the layer of metal catalyst 140 to perform diffusion process, wherein energy loss is increased as the laser beam irradiated region is exposed to the outside in case that the laser beam is directly irradiated onto the layer of metal catalyst 140 without forming a protection film on the layer of metal catalyst. Furthermore, it can be difficult to uniformly control low concentration of the metal catalyst as the metal catalyst is not protected, but it is vaporized since the laser beam is directly irradiated onto the metal catalyst. Therefore, the fourth preferred embodiment of the present invention enables low concentration of the metal catalyst to be controlled uniformly by forming the metal catalyst protection layer 345 on the metal catalyst layer and irradiating the laser beam 360 onto the metal catalyst protection layer 345.

The metal catalyst protection layer 345 can be formed of silicon nitride film or silicon oxide film. Additionally, a film capable of being etched together with capping layer at the same time is preferably used since the metal catalyst protection layer 345 is removed after forming a polycrystalline silicon layer.

A fabrication method of thin film transistor according to the fourth preferred embodiment of the present invention is the same as the fabrication method of thin film transistor according to the first preferred embodiment of the present invention except the above mentioned description.

Figure 4:
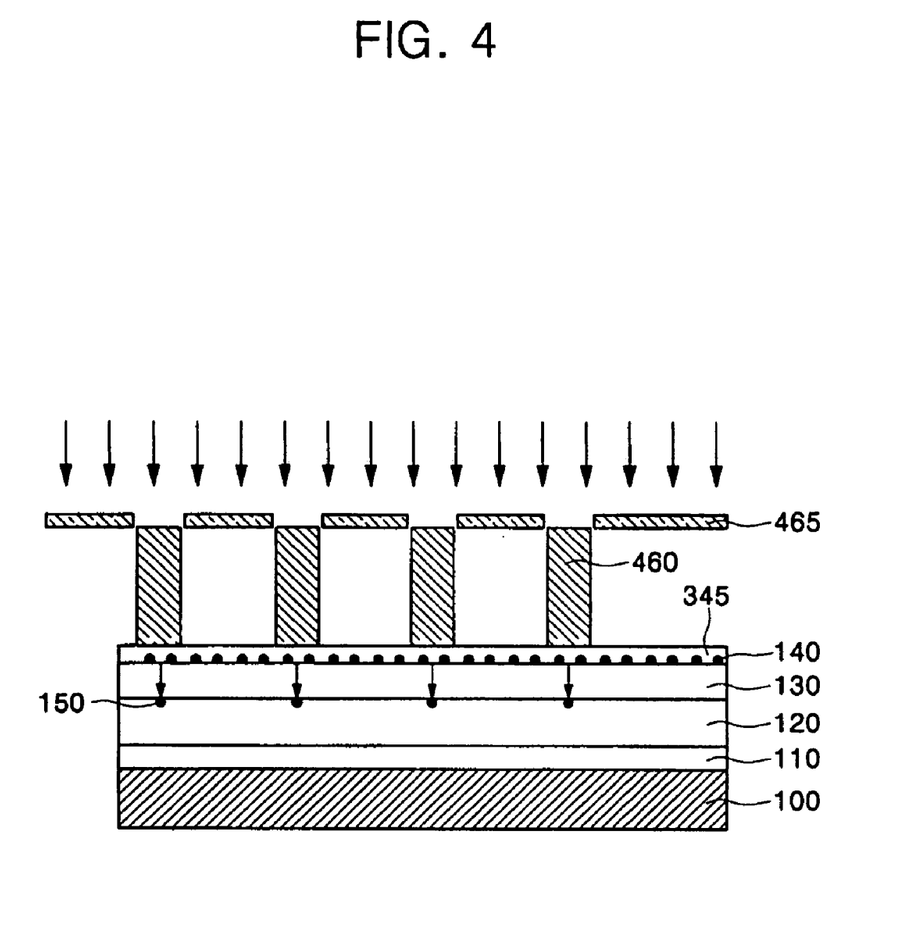
FIG. 4 is a cross-sectional structure chart for explaining a fabrication method of thin film transistor according to fifth preferred embodiment of the present invention.

FIG. 4 is a cross-sectional structure chart for explaining a fabrication method of thin film transistor according to fifth preferred embodiment of the present invention.

Referring to FIG. 4, a buffer layer 110, amorphous silicon layer 120, capping layer 130, layer of metal catalyst 140 and metal catalyst protection layer 345 are sequentially laid up on a substrate 100.

A laser beam 460 is irradiated onto the metal catalyst protection layer 345 so that the metal catalyst 140 is diffused into the amorphous silicon layer 120, wherein the laser beam 460 is irradiated onto the metal catalyst protection layer 345 through a patterned mask 465 so that a seed 150 is formed on a desired part.

A fabrication method of thin film transistor according to the fifth preferred embodiment of the present invention is the same as the fabrication method of thin film transistor according to the third preferred embodiment of the present invention except the above mentioned description.

As described in the above, the present invention has a merit that a fabrication method of thin film transistor for improving characteristics of device and obtaining uniformity of the device by enabling low concentration diffusion of metal catalyst to be uniformly controlled through selective irradiation of laser beam and controlling size of grains and crystal growing position and direction in crystallization of amorphous silicon layer using super grain silicon method is provided.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A fabrication method of thin film transistor comprising:
    forming an amorphous silicon layer on a substrate;
    forming a capping layer on the amorphous silicon layer;
    forming a metal catalyst layer on the capping layer;
    diffusing metal catalyst by selectively irradiating a laser beam onto the metal catalyst layer; and
    crystallizing the amorphous silicon layer.
2. The fabrication method of thin film transistor according to claim 1,
    wherein the laser beam is a dot type laser beam.
3. The fabrication method of thin film transistor according to claim 2,
    wherein the dot type laser beam is formed in a circular, triangular, rectangular, trapezoidal or rhombic shape.
4. The fabrication method of thin film transistor according to claim 1,
    wherein the laser beam is a line type laser beam.
5. The fabrication method of thin film transistor according to claim 1,
    wherein the laser beam is irradiated through a patterned mask.
6. The fabrication method of thin film transistor according to claim 1,
    wherein the capping layer is formed of a silicon nitride film or silicon oxide film.
7. The fabrication method of thin film transistor according to claim 1,
    wherein the metal catalyst is nickel.
8. The fabrication method of thin film transistor according to claim 1,
    wherein the metal catalyst layer has thickness of 2 Å or less.
9. The fabrication method of thin film transistor according to claim 1,
    wherein the crystallization of the amorphous silicon layer is performed by thermal annealing.
10. A fabrication method of thin film transistor comprising:
    forming an amorphous silicon layer on a substrate;
    forming a capping layer on the amorphous silicon layer;
    forming a metal catalyst layer on the capping layer;
    forming a metal catalyst protection layer on the metal catalyst layer;
    diffusing metal catalyst by selectively irradiating a laser beam onto the metal catalyst protection layer; and
    crystallizing the amorphous silicon layer.
11. The fabrication method of thin film transistor according to claim 10,
    wherein the laser beam is a dot type laser beam.
12. The fabrication method of thin film transistor according to claim 11,
    wherein the dot type laser beam is formed in a circular, triangular, rectangular, trapezoidal or rhombic shape.
13. The fabrication method of thin film transistor according to claim 10,
    wherein the laser beam is a line type laser beam.
14. The fabrication method of thin film transistor according to claim 10,
    wherein the laser beam is irradiated through a patterned mask.
15. The fabrication method of thin film transistor according to claim 10,
    wherein the capping layer is formed of a silicon nitride film or silicon oxide film.
16. The fabrication method of thin film transistor according to claim 10,
    wherein the metal catalyst is nickel.
17. The fabrication method of thin film transistor according to claim 10,
    wherein the metal catalyst layer has thickness of 2 Å or less.
18. The fabrication method of thin film transistor according to claim 10,
    wherein the crystallization of the amorphous silicon layer is performed by thermal annealing.
19. The fabrication method of thin film transistor according to claim 10,
    wherein the metal catalyst protection layer is formed of a silicon nitride film or silicon oxide film.
20. The fabrication method of thin film transistor according to claim 10,
    wherein the metal catalyst protection layer is formed of a film that is capable of being etched together with the capping layer at the same time.

* * * * *